(12) United States Patent
Merrill et al.

(10) Patent No.: US 7,502,066 B1
(45) Date of Patent: Mar. 10, 2009

(54) METHODS FOR MANUFACTURING AND TESTING IMAGE SENSING DEVICES

(75) Inventors: Richard B. Merrill, Redwood City, CA (US); Peter J. Manca, Sunnyvale, CA (US); Timothy M. Slagle, Menlo Park, CA (US)

(73) Assignee: Foveon, Inc., San Jose, CA (US)

( * ) Notice: Subject to any disclaimer, the term of this patent is extended or adjusted under 35 U.S.C. 154(b) by 1009 days.

(21) Appl. No.: 10/289,091

(22) Filed: Nov. 5, 2002

(51) Int. Cl.
H04N 5/225 (2006.01)
H04N 17/02 (2006.01)
H04N 5/76 (2006.01)
H01L 27/00 (2006.01)

(52) U.S. Cl. .................. 348/360; 348/374; 348/187; 348/231.6; 250/208.1

(58) Field of Classification Search ........... 348/360, 348/374, 187, 188, 231.3, 231.6, 247, 294, 348/72, 211.14; 250/208.1; 396/211, 321
See application file for complete search history.

(56) References Cited

U.S. PATENT DOCUMENTS

| | | | |
|---|---|---|---|
| 4,899,205 A | | 2/1990 | Hamdy et al. |
| 5,019,878 A | | 5/1991 | Yang et al. |
| 5,040,068 A | * | 8/1991 | Parulski et al. ............ 348/376 |
| 5,257,222 A | | 10/1993 | Lee |
| 5,328,865 A | | 7/1994 | Boardman et al. |
| 5,523,608 A | * | 6/1996 | Kitaoka et al. ............ 257/433 |
| 5,627,583 A | * | 5/1997 | Nakamura et al. ........... 348/72 |
| 5,668,596 A | * | 9/1997 | Vogel ........................ 348/273 |
| 5,672,994 A | | 9/1997 | Au et al. |
| 5,774,011 A | | 6/1998 | Au et al. |
| 5,793,094 A | | 8/1998 | Sanchez et al. |
| 5,883,830 A | | 3/1999 | Hirt et al. |
| 6,150,868 A | | 11/2000 | Kim et al. |
| 6,156,588 A | | 12/2000 | Sanchez et al. |
| 6,242,335 B1 | | 6/2001 | Sher et al. |
| 6,285,068 B1 | | 9/2001 | Kang et al. |
| 6,293,465 B1 | | 9/2001 | Heller et al. |
| 6,295,082 B1 | * | 9/2001 | Dowdy et al. ............... 348/72 |
| 6,313,868 B1 | * | 11/2001 | D'Alfonso et al. ........... 348/72 |
| 6,396,539 B1 | * | 5/2002 | Heller et al. .............. 348/246 |
| 6,430,313 B1 | * | 8/2002 | Smith et al. ............... 382/167 |
| 6,504,572 B2 | * | 1/2003 | Kramer et al. ............ 250/208.1 |
| 6,726,103 B1 | * | 4/2004 | Motta et al. .............. 235/454 |
| 6,778,212 B1 | * | 8/2004 | Deng et al. ............... 348/294 |
| 6,879,340 B1 | * | 4/2005 | Chevallier ................ 348/294 |

* cited by examiner

*Primary Examiner*—John M Villecco
(74) *Attorney, Agent, or Firm*—Lewis and Roca LLP

(57) ABSTRACT

A method of manufacturing an imaging subsystem is provided. The method includes manufacturing an image sensing device including a unique identifier. The image sensing device is incorporated into an imaging subsystem. The imaging subsystem is operated and characterization parameters of the image sensing device operation are determined based thereon. The characterization parameters are associated with the unique identifier in a repository of characterization parameters that is separate from the imaging subsystem.

6 Claims, 7 Drawing Sheets

METHODS FOR MANUFACTURING AND TESTING IMAGE SENSING DEVICES

TECHNICAL FIELD

The present application is in the field of image sensing devices includible in systems such as digital cameras and, in particular, is in the field of associating characterization parameters with a particular image sensing device such that a system in which the image sensing device is included may access the characterization parameters and perform processing of image data generated by the image sensing device based on the accessed characterization parameters.

BACKGROUND

Image sensing devices are known in the art. For many applications, an image sensing device is formed in an integrated circuit "chip" and the so-formed chip is included as part of an imaging system. As one example, image sensing devices are included in digital cameras. The image sensing devices typically record color images by employing pixel sensors to independently sense the image to be recorded in red, green and blue color channels. The channel signals generated by the pixel sensors are then stored and subsequently processed to generate a corresponding image.

The spectral response of such image sensing devices varies from chip to chip, primarily due to manufacturing variations. In general, a transformation is applied to convert the generated channel signals into a standard color space for processing by the system of which the image sensing device is a part. Such a transformation is known as a color transformation. Each imager is calibrated by determining its spectral response and computing a color transformation based on the determined spectral response. The computed calibration parameters are used as input to the color transformation.

The spectral response of an image sensing device is primarily a function of the characteristics of the pixel sensors collectively (including chip sensitivities and filters applied to the image sensing device) and any additional filters ("prefilters") that are used to shape the overall response (for example, by rejecting infrared light). The spectral characteristics of the prefilters also vary due to manufacturing variations. Furthermore, the image sensing device may be packaged as part of an imaging sub-assembly, that includes the image sensing device along with prefilter(s) and/or other elements. The calibration parameters for the entire imaging sub-assembly are typically computed before incorporating the sub-assembly into an imaging system such as an assembled camera.

To compute the calibration parameters, both specialized test setups and knowledge of color theory are typically employed, neither of which is typically available to an electronics assembler. Therefore, it is desirable that the calibration parameters be computed before providing the imaging sub-assembly to the imaging system manufacturer, and that the computed calibration parameters be provided to the imaging system manufacturer along with the imaging sub-assembly in a manner that is not prone to mismatches between a particular imaging sub-assembly and the computed calibration parameters for that sub-assembly.

SUMMARY

In accordance with one aspect, a method of manufacturing an imaging subsystem is provided. The method includes manufacturing an image sensing device including a unique identifier. The image sensing device is incorporated into an imaging subsystem. The imaging subsystem is operated and characterization parameters of the image sensing device operation are determined based thereon. The characterization parameters are associated with the unique identifier in a repository of characterization parameters that is separate from the imaging subsystem.

In accordance with another aspect, a method is provided to perform imaging subsystem testing during assembly of an imaging system including an image sensor. A memory circuit of the image sensor is accessed to read a unique identifier of the image sensor. The imaging subsystem, including the image sensor, is operated to obtain test image data. The obtained test image data is saved in a repository in correspondence with the read unique identifier.

In accordance with another aspect, a method is provided to manufacture an imaging subsystem. An image sensing device including a unique identifier is manufactured. The image sensing device is incorporated into an imaging subsystem. The imaging subsystem is operated and calibration parameters are determined based thereon. The calibration parameters are associated with the unique identifier in a repository of calibration parameters.

In accordance with another aspect, a method is provided to manufacture an imaging subsystem. An image sensing device is manufactured, including manufacturing the image sensing device to include a memory structure. The image sensing device is incorporated into an imaging subsystem. The imaging subsystem is operated and calibration parameters are determined based thereon. The calibration parameters are stored in the memory structure of the image sensing device.

In accordance with another aspect, an imaging system is provided. The imaging system includes an imaging subsystem including an image sensing device having a memory structure incorporated thereon. A processing unit is programmed to read calibration parameters from the memory structure and to process raw image data generated by the imaging subsystem based at least in part on the calibration parameters.

In accordance with another aspect, a method of repairing an imaging system is provided. An existing imaging subsystem of the imaging system is removed. A new imaging subsystem is installed into the imaging system, the new imaging subsystem including a memory having a unique identifier stored therein. A repository of characterization parameters associated with the new imaging subsystem is accessed based on the unique identifier. The imaging system is operated in accordance with the characterization parameters.

In accordance with another aspect, a method is provided to selectively program a MOS capacitor antifuse having a gate region formed on an oxide layer and having a well region formed in a semiconductor layer. A programming voltage is caused to be applied to the gate region of the MOS capacitor antifuse such that a short is formed from the gate region through the oxide layer, to the well region in the semiconductor layer.

In accordance with another aspect, a circuit is provided to program a MOS capacitor antifuse having a gate region formed on an oxide layer and having a well region formed in a semiconductor layer. Programming voltage application circuitry is coupled to the MOS capacitor antifuse and is configured to cause the programming voltage to be applied to the gate region of the MOS capacitor antifuse such that a short is formed from the gate region through the oxide layer, to the well region in the semiconductor layer.

In accordance with another aspect, an integrated circuit is provided. The integrated circuit has an image sensor and a memory structure formed unitarily thereon. The memory structure includes a plurality of MOS capacitor antifuses, each MOS capacitor antifuse having a gate region formed on an oxide layer and having a well region formed in a semiconductor layer, wherein each of a subset of the MOS capacitor antifuses are programmed such that there is a conductive electrical path through a failed oxide portion of the MOS capacitor.

DETAILED DESCRIPTION

In accordance with an embodiment of the invention, a non-volatile memory structure is incorporated into the die of a CMOS image sensing device to hold data corresponding to that CMOS image sensing device. The image sensing device includes a plurality of pixel sensors. In accordance with one aspect, the circuit structure is utilized to hold an identification (such as a serial number) or other data corresponding to that die. Thus, for example, a processing apparatus external to the image sensing device may use a serial number unique to the die to correlate calibration parameters with the image sensing device or to a sub-assembly or assembly including the image sensing device. The memory structure may be, for example, a floating gate EPROM memory, a one-time programmable anti-fuse memory or other technology.

Figure 1:
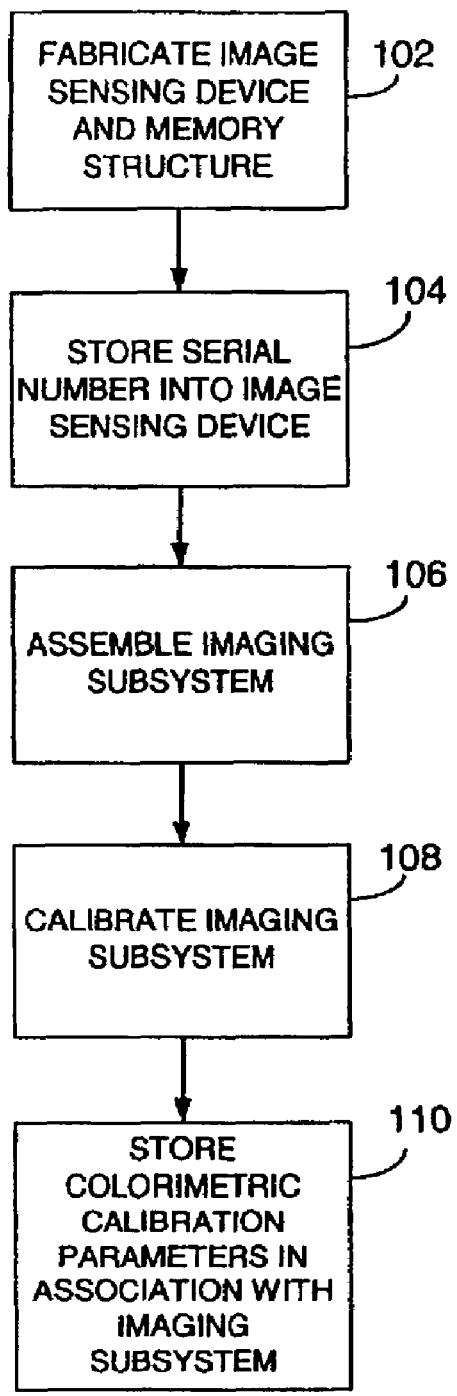
FIG. 1 is a flowchart illustrating a process to associate computed calibration parameters with an imaging subsystem including an image sensing device.

A process to associate calibration parameters with an imaging subsystem, that includes an image sensing device, is described with reference to FIG. 1. Step 102 is a step of fabricating a plurality of image sensing device dies on a wafer, including a memory structure associated with each die. At step 104, a unique identifier is stored into the memory structure. In some embodiments, the unique identifier is merely a serial number. Thereafter, the wafer is divided up into the image sensing devices and packaged in a final assembly with affixed prefilters.

At step 106, an imaging subsystem is assembled employing one of the image sensing devices. The imaging subsystem includes, for example, the image sensing device and prefilters that shape the light spectrum actually sensed by the image sensing device. For example, a prefilter may be employed to reject infrared light. At step 108, calibration parameters are determined useable to define appropriate transformation processing to be performed on an image obtained using a camera that includes the imaging subsystem. While in some embodiments, the calibration parameters are useable for color transformation processing, the calibration parameters may be other characterization parameters derived from the characteristics of the pixel sensors collectively.

At step 110, the determined calibration parameters are stored in a manner such that they can be retrieved and associated with the particular image subsystem to which they correspond. In accordance with one embodiment, the determined calibration parameters are stored in the memory structure of the image sensing device.

The calibration parameters may include, for example, the following:
- transformation data, such as RGBin->XYZout or RGBout transform matrices (for different output color spaces) and
- Linearization look up tables.
- Other color/ICC profile information such as multidimensional lookup tables
- Bias voltage levels It should be noted that, if the determined parameters are close to some average or other predetermined value, then a delta from the predetermined value can be stored. The delta values would typically have less dynamic range than the values themselves and, thus, can be stored using less memory (or, using the same memory, can be stored to greater precision).

Figure 2:
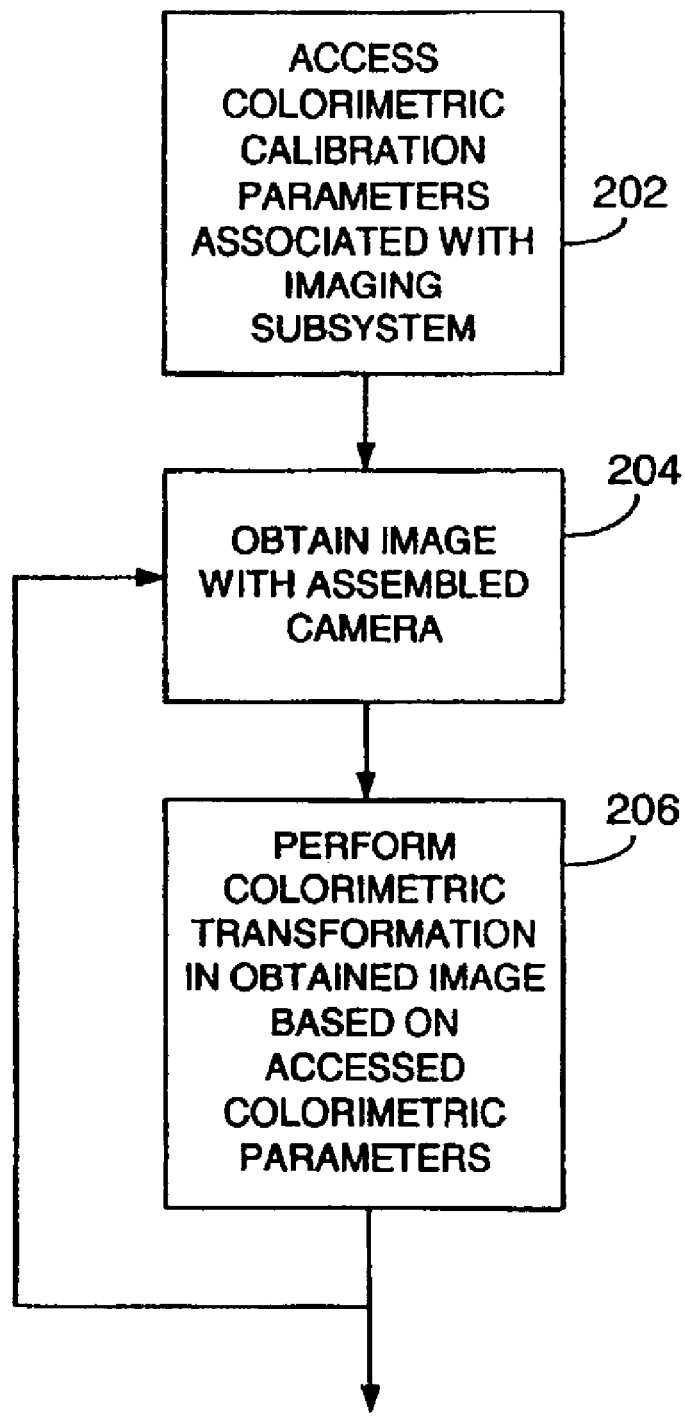
FIG. 2 is a flowchart illustrating a process to access and utilize the calibration parameters.

FIG. 2 is a flowchart illustrating how, in one embodiment, the determined calibration parameters stored in the memory structure are utilized during operation of a camera. At step 202 (which occurs, for example, at power on of the camera), under the control of a processor in the camera, the determined parameters are copied from the memory structure of the image sensing device into a working memory of the camera. At step 204, raw image data is obtained using the camera. At step 206, under the control of the processor, the camera performs a transformation of the raw image data using the determined calibration parameters. Then, steps 204 and 206 are repeated to obtain and transform further raw image data. If the imaging subsystem is ever replaced, appropriate calibration parameters for the replacement imaging subsystem are automatically provided for use in operation of the camera.

In accordance with other embodiments, characterization parameters (which, as discussed above, characterize the operation of the pixel sensors of an image sensor collectively) and/or other characterization parameters (that, for example, characterize the operation of individual pixel sensors or of spatial variation of pixel sensors) may be stored in a repository separate from the imaging subsystem, in a manner such that they can be retrieved and associated with the particular image subsystem to which they correspond. Other stored characterization parameters may include, for example, the following:
- Bad row or column information
- Bad or "hot" pixel locations
- Color shift compensation information
- Leakage compensation information
- Temperature characteristics for correcting thermal variations In addition, test image data obtained from operating the imaging subsystem may be stored in the repository along with the unique identifier of the image sensor.

Figure 3:
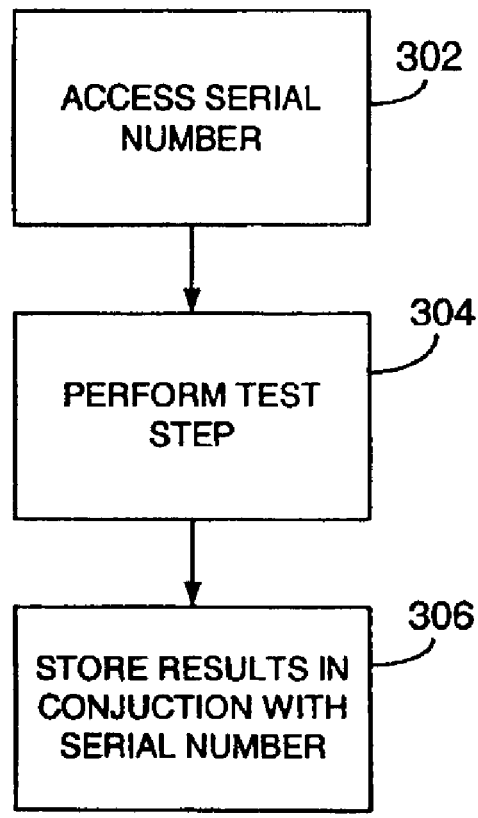
FIG. 3 is a flowchart illustrating a process to access and utilize an image sensing device serial number during the process of testing an image sensing subassembly or camera.

FIG. 3 is a flowchart illustrating how the unique identifier may be utilized during a testing process of the image sensing device, the imaging subsystem and a completed camera. In particular, at step 302, the unique identifier (designated in FIG. 3 as a serial number) is accessed. At step 304, a particular test step is performed. At step 306, the test results are stored, typically in a test data repository external to the image sensing device, in association with the unique identifier. The test step may be, for example, any test that would or could be performed during fabrication and qualification of a completed camera or a camera subassembly.

Now, a particular embodiment of a method and circuit for storing the unique identifier and/or other data in a memory structure on the image sensing device is described with reference to FIG. 4 through FIG. 7. In general, in accordance with this particular embodiment, an antifuse circuit is utilized to hold the unique identifier and/or other data. While antifuse circuits are generally known in the art, conventional antifuse circuits are disadvantageous for holding a unique identifier and/or other data during an imager fabrication and test process. First, many such conventional antifuse circuits require additional fabrication process steps to form the antifuse that would not otherwise be utilized to fabricate an image sensing device. Other conventional antifuse circuits do not require such additional fabrication steps, but may not be reliably programmed. For example, U.S. Pat. No. 5,672,994 to Au et al. (see FIGS. 6 and 8 of the Au et al. patent, in particular) discloses forming an antifuse using an NFET transistor by applying a high voltage to the NFET drain to form a bridge from the drain, through the channel, to the source electrode.

Figure 4:
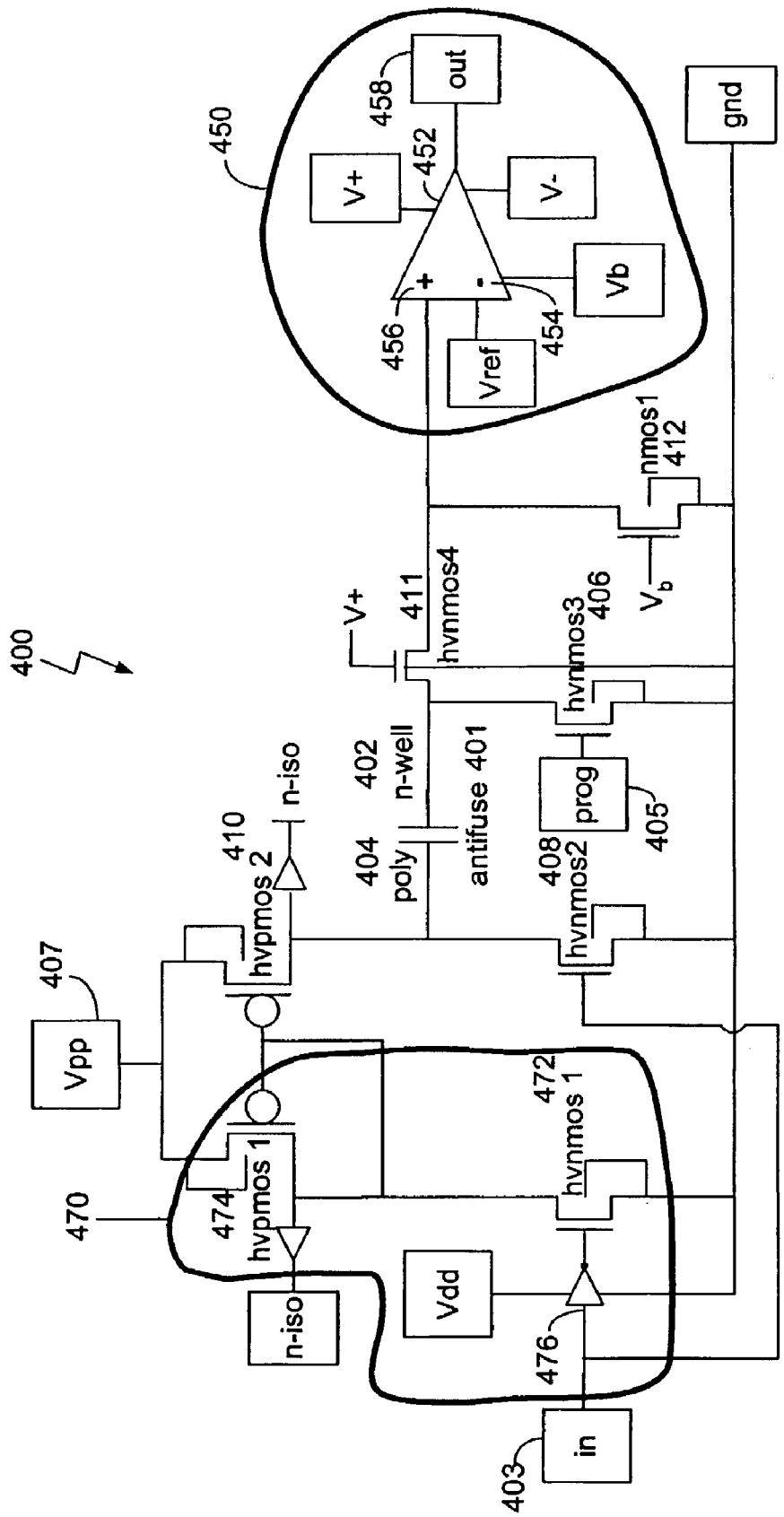
FIG. 4 schematically illustrates circuitry for programming one bit of information, such as a serial number or calibration parameters, into an antifuse of the image sensing device and to verify such programming.

In accordance with an embodiment, an antifuse is formed from a MOS capacitor without requiring additional fabrication steps. One example antifuse programming circuit 400 that can operate to program the MOS capacitor antifuse is schematically illustrated in FIG. 4. The operation of the example circuit 400 can be better understood with reference to the MOS capacitor 600 schematically illustrated in FIG. 6. The circuit 400 operates on the MOS capacitor 600 (specifically shown as antifuse 401 in FIG. 4) to program the antifuse such that the gate region 602 is shorted to the n-well 604 through the gate oxide 608. That is, a voltage is applied to the gate region 602 such that the gate oxide 608 between the gate region 602 and the channel 603 is caused to fail. Typically, the fabrication processing is such that the quality and thickness of the gate oxide 608 are extremely closely controlled. As a result, the voltage at which the gate oxide 608 fails is very predictable.

Turning now to FIG. 4, the operation of the programming circuit 400 is described. An externally-controlled power supply signal Vpp 407 is provided. During programming, the prog signal 405 at high voltage NMOS 406 (hvnmos3) is controlled externally to be held high. The poly side 404 of the antifuse capacitor 401 is held to the level of the externally-controlled Vpp signal 407 by high voltage PMOS 410 (hvpmos2). To program the antifuse 401, the Vpp signal 407 is pulsed (in one embodiment, to 10V). The state of the input signal in 403 controls whether the Vpp signal 407 pulse is enabled to be applied to the poly 404, to program the antifuse 401. If the input signal in 403 is low, then the Vpp signal 407 pulse is enabled to be provided to the poly side 404 of the antifuse 401 such that the oxide fails, creating an ohmic short across the antifuse capacitor 401. On the other hand, if the input signal in 403 is high, then the Vpp signal 407 pulse is not enabled to be provided to the poly side 404 of the antifuse. The high voltage NMOS 411 (hvrmos4) acts as a protection circuit for all of the circuits to the right of high voltage NMOS 411 in FIG. 4. It accomplishes this by limiting the voltage at its source. When the high voltage pulse is applied across antifuse 401, the n-well side of the antifuse 402 can reach a high voltage. When the drain of high voltage NMOS 411 is pulled up above the voltage on its gate (set by V+), the NMOS 411 transistor shuts off and the high voltage is not conducted to the source of the NMOS 411 transistor.

Details of how the programming circuit 400 operates based on the input signal in 403 are now discussed in conjunction with the level translator circuit 470. The level translator circuit 470, including the high voltage NMOS 472 (hvpmos1) and the high voltage PMOS 474 (hvpmos1) is provided to protect various transistors of the circuit 400. For example, while Vds of the high voltage PMOS 410 (hvpmos2) can be large, Vgs of the high voltage PMOS 410 (hvpmos2) is preferably kept within the normal operating range of 2.0V to avoid damage. In operation of the level translator circuit 470, when high voltage NMOS 472 (hvnmos1) is on, high voltage PMOS 474 (hvpmos1) is also on because of the diode-connected gate of high voltage PMOS 474 (hvpmos1). The gate of high voltage PMOS 474 (hvpmos1) is coupled to the gate of high voltage PMOS 410 (hvpmos2), so high voltage PMOS 410 (hvpmos2) is also on.

The input signal in 403 is connected to the gate of high voltage NMOS 472 (hvnmos1) through an inverter 476, and the input signal in 403 is also directly connected to the gate of high voltage NMOS 408 (hvnmos2). When the input signal in 403 is low, high voltage NMOS 472 (hvnmos1) is on, high voltage NMOS 408 (hvnmos2) is off and high voltage PMOS 410 (hvpmos2) is on. In this state, the poly side 404 of the antifuse 401 is held to the level of the Vpp signal 407 and the pulse of the Vpp signal 407 is applied to the poly 404. On the other hand, when the input signal in 403 is high, high voltage NMOS 472 (hvnmos1) is off, high voltage NMOS 408 (hvnmos2) is on and high voltage PMOS 410 (hvpmos2) is off. In this state, the poly side 404 of the antifuse 401 is being pulled to ground regardless of the state of the Vpp signal 407. Thus, to program the antifuse, the input signal in 403 is set to the low state.

Figure 7:
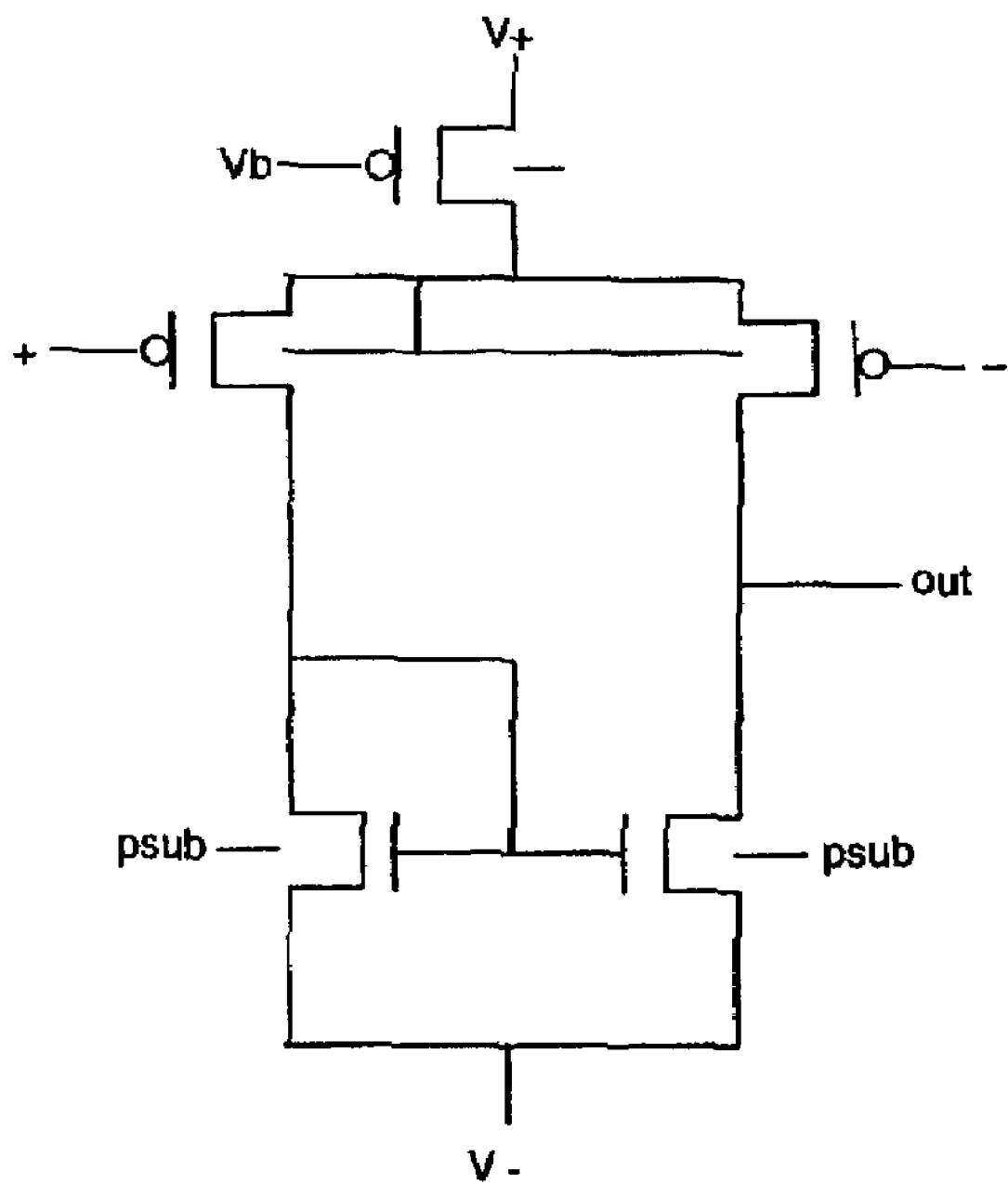
FIG. 7 schematically illustrates an example of a comparator useable in the FIG. 4 embodiment.

Readout circuitry 450 of the programming circuit 400 can be utilized to verify proper programming of the antifuse 401. The readout circuitry 450 operates by connecting the poly side 404 of the antifuse capacitor 401 to Vpp=2.0V, through the high voltage PMOS 410 (hvpmos2). The NMOS 412 (nmos1) is biased with Vb to provide a weak pull down of the positive input of comparator 456. An open antifuse has a resistance of about $10^{17}$ ohms and a properly programmed antifuse has a resistance of about 1 ohms. The negative input 454 of a read comparator 452 is connected to a reference voltage Vref, and the positive input 456 of the read comparator 452 is connected to the n-well 402. If the antifuse 401 is open (i.e., not programmed), then there is not a conductive path from the n-well 402 to Vpp 407. In this case, the positive input 456 of the comparator 452 is pulled to ground through NMOS 412 (nmos1), and a zero is read at the output 458 of the comparator 452. On the other hand, if the antifuse capacitor 401 is shorted (i.e., programmed), then there is a conductive path from the n-well 402 to Vpp 407 that dominates the weak pulldown of NMOS 412 (nmos1). In this case, the positive input 456 is pulled high via the antifuse 401, and a one is read at the output 458 of the comparator 452. FIG. 7 illustrates a particular example of a comparator 452, a standard one stage transconductance amplifier.

In some embodiments, other circuitry (not shown) is provided to accomplish serialization and other "housekeeping" functions. For example, a shift register may be provided for reading programming data in and out, and logic may be provided for the control inputs.

Figure 5:
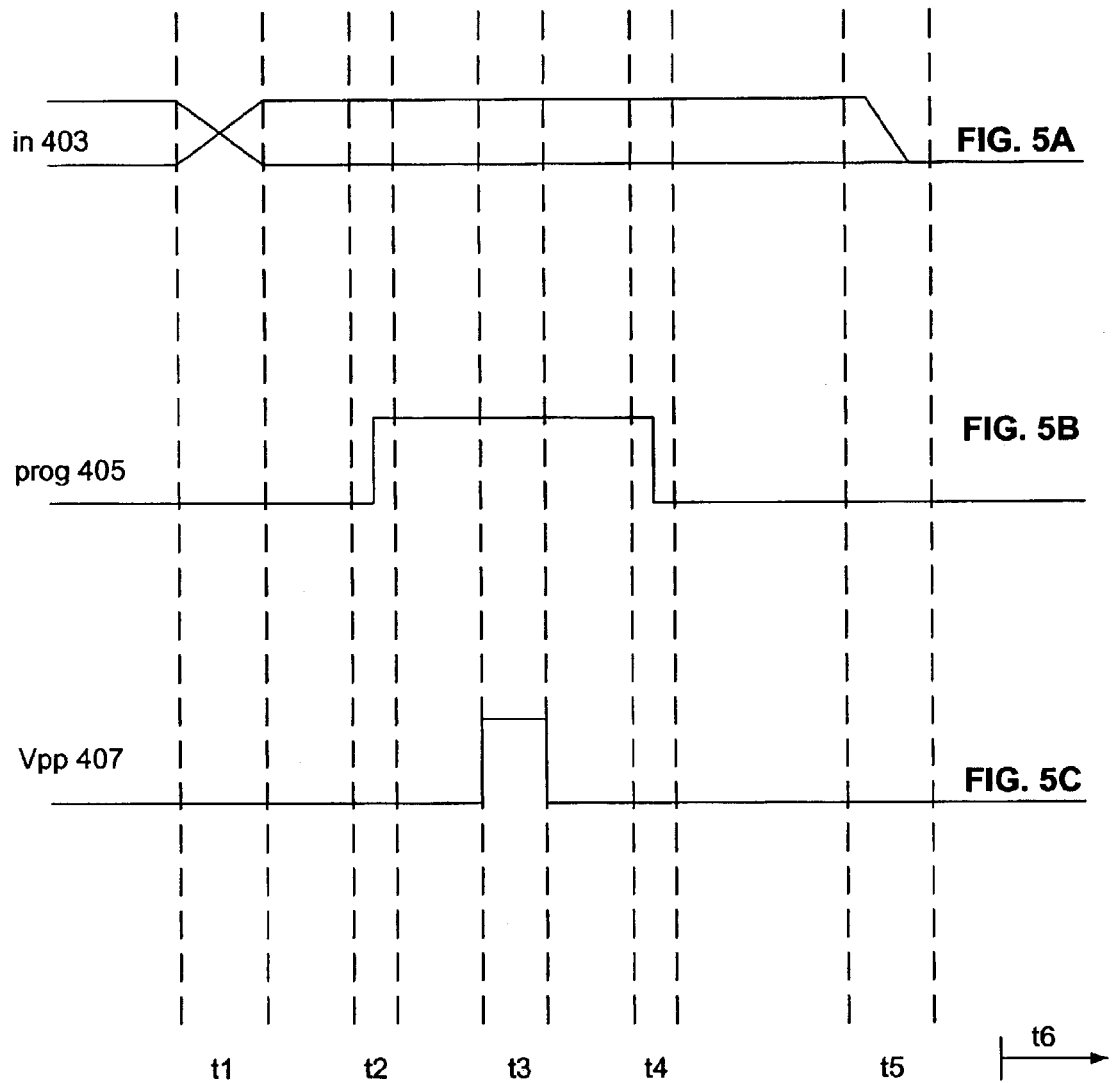
FIGS. 5A, 5B and 5C collectively illustrate the timing of various signals within the FIG. 4 circuit.
Figure 6:
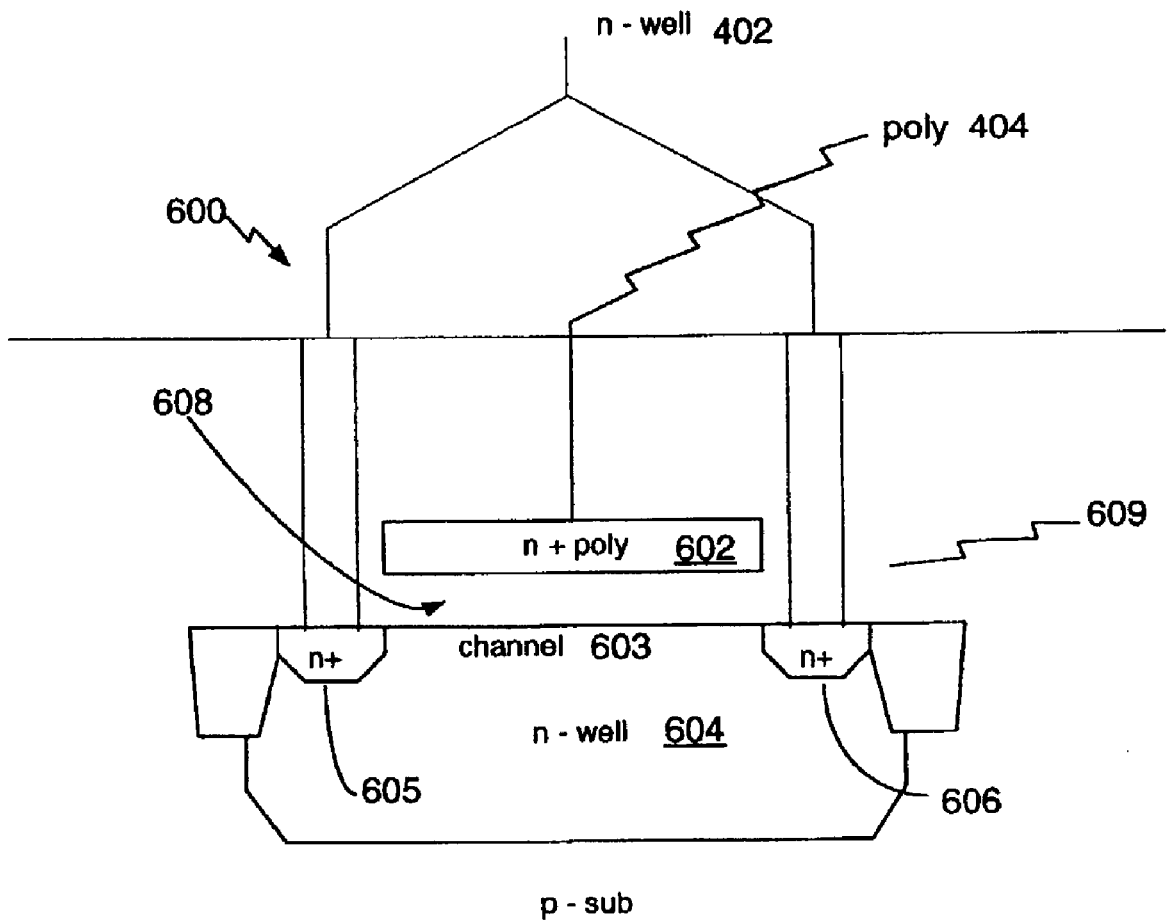
FIG. 6 schematically illustrates a MOS capacitor used as a programmable antifuse, including a resulting programmed antifuse.

FIG. 5 is a timing diagram that illustrates the timing of various signals occurring in the FIG. 4 circuit. At time t1, the input signal in 403 settles. At time t2, the prog signal 405 is transitioned from a low level to a high level. At time t3, the Vpp signal is pulsed to program the antifuse. At time t4, the prog signal 405 is transitioned to the level for readout detection of the antifuse 401 resistance.

While embodiments and applications have been shown and described, it is apparent to those skilled in the art that many more modifications than mentioned above are possible without departing from the inventive concepts herein. The invention, therefore, is not to be restricted except in the spirit of the appended claims.

What is claimed is:

1. A method of manufacturing an imaging subsystem, comprising:

manufacturing an image sensing device including a unique identifier;

incorporating the image sensing device into an imaging subsystem;

operating the imaging subsystem and determining characterization parameters of the image sensing device operation based thereon;

associating the characterization parameters with the unique identifier in a repository of characterization parameters that is separate from the imaging subsystem; and incorporating the imaging subsystem into an imaging system, including:

detecting the unique identifier;

retrieving the characterization parameters from the repository based on the detected unique identifier; and providing a processing unit programmed to process raw image data generated by the imaging subsystem based at least in part on the retrieved characterization parameters.

2. A method of manufacturing an imaging subsystem, comprising:

manufacturing an image sensing device including a unique identifier;

incorporating the image sensing device into an imaging subsystem;

operating the imaging subsystem and determining calibration parameters based thereon; and using the unique identifier as an index pointing to the calibration parameters in a repository of calibration parameters.

3. The method of claim 2, further comprising:

incorporating the imaging subsystem into an imaging system, including detecting the unique identifier;

retrieving the calibration parameters from the repository based on the detected unique identifier; and providing a processing unit programmed to process raw image data generated by the imaging subsystem based at least in part on the retrieved calibration parameters.

4. The method of claim 3, wherein:

the image sensing device manufacturing step includes manufacturing the image sensing device to include a memory structure; and storing the unique identifier in the memory structure.

5. The method of claim 2, wherein:

the image sensing device manufacturing step includes manufacturing the image sensing device to include a memory structure; and the step of associating the calibration parameters with the unique identifier includes storing the calibration parameters in the memory structure.

6. The method of claim 2, wherein:

the image sensing device manufacturing step includes manufacturing the image sensing device to include a memory structure; and storing the unique identifier in the memory structure.

\* \* \* \* \*